United States Patent
Gaschke

[11] Patent Number: 5,748,007
[45] Date of Patent: May 5, 1998

[54] UNIVERSAL TEST AND BURN-IN SOCKET ADAPTABLE TO VARYING IC MODULE THICKNESS

[75] Inventor: Paul Mathew Gaschke, Wappinger Falls, N.Y.

[73] Assignee: International Business Machines Corporation, Armonk, N.Y.

[21] Appl. No.: 662,406

[22] Filed: Jun. 12, 1996

[51] Int. Cl.⁶ .................................................. G01R 31/02
[52] U.S. Cl. ........................................ 324/755; 324/754
[58] Field of Search ............................... 324/754, 755, 324/758, 760; 439/66, 67, 68, 69, 70, 71, 72, 73, 74

[56] References Cited

U.S. PATENT DOCUMENTS

| | | | |
|---|---|---|---|
| 3,458,807 | 7/1969 | Smith et al. | 324/73 |
| 3,564,408 | 2/1971 | Schulz et al. | 324/158 |
| 4,420,203 | 12/1983 | Aug et al. | 339/17 |
| 4,456,318 | 6/1984 | Shibata et al. | 339/17 |
| 4,714,879 | 12/1987 | Krause | 324/158 |
| 4,846,703 | 7/1989 | Matsuoka et al. | 439/71 |
| 5,086,269 | 2/1992 | Nobi | 324/760 |
| 5,209,028 | 5/1993 | McDermott et al. | 51/426 |
| 5,302,853 | 4/1994 | Volz et al. | 257/707 |
| 5,312,267 | 5/1994 | Matsuoka et al. | 439/331 |
| 5,364,286 | 11/1994 | Matsuoka | 439/331 |
| 5,368,498 | 11/1994 | Matsuoka et al. | 439/331 |
| 5,409,392 | 4/1995 | Marks et al. | 439/266 |
| 5,410,258 | 4/1995 | Bowers et al. | 324/755 |
| 5,493,237 | 2/1996 | Volz et al. | 324/755 |
| 5,534,785 | 7/1996 | Yoshizaki et al. | 324/758 |

FOREIGN PATENT DOCUMENTS 1647 930 A 6/1988 U.S.S.R.

*Primary Examiner*—Ernest F. Karlsen
*Assistant Examiner*—Anh Phung
*Attorney, Agent, or Firm*—H. Daniel Schnurmann

[57] ABSTRACT

A socket assembly designed to hold an IC module during testing or burn-in is described. The apparatus includes: a base, an integrated or a modular interposer, a printed circuit board, and an optional stiffener. The interposer is provided with an array of contacts to provide electrical signals to the IC module. The base upon which the module rests is provided with a plate having holes that match the contacts in the interposer. Two jaws, positioned on opposite sides of the socket, are attached to shafts which limit the jaws to a vertical movement. The jaws are further controlled by a U-shaped actuation lever, which ends are connected to off-center cams pinned to the jaws. The jaws are able to move up sufficiently to enable the module to be inserted without requiring added lateral motion. When the socket is in a closed position, the jaws urge the module against the electrical contacts. The design accommodates variable module thicknesses, and is further designed to optimize the forced convective cooling effect.

22 Claims, 5 Drawing Sheets

UNIVERSAL TEST AND BURN-IN SOCKET ADAPTABLE TO VARYING IC MODULE THICKNESS

FIELD OF THE INVENTION

This invention relates to a socket used for testing and for burn-in and, more particularly, to a reusable socket which is suitable to accommodate modules of varying thickness and which allows a module to be subjected to forced convective cooling.

BACKGROUND OF THE INVENTION

Test sockets adapted to carry integrated circuit chips (ICs) have been routinely used in the art during testing and burn-in. These sockets are commonly used to hold in place a module carrying one or more IC chips, the combination of which is placed in an oven or a furnace during burn-in for a predetermined number of hours.

Burn-in is normally performed immediately after functional testing. In as much as IC chips are to perform under varying environments and temperatures, burn-in is routinely appended to testing to accelerate the occurrence of early fails, thereby improving the overall product quality.

Sockets are designed to hold a variety of IC products, and are usually customized to the precise foot-print of the chip carrier, (i.e., a single-chip module or a multi-chip module). Economic reasons encourage the reuse of a socket whenever possible, even when ICs have different footprints and oftentimes different I/O contacts. Examples of the latter include pin-grid-arrays (PGA), land-grid-arrays (LGA), ball-grid-arrays (BGA), and the like.

Today's IC modules, particularly those made of ceramic, glass ceramic, or glass commonly comprise a plurality of layers, wherein each layer is used as a ground plane, a power plane, or as a personalization plane that provides interconnections between chips mounted on the module. The number of layers typically varies from 10 to 70. Practitioners of the art will fully appreciate that in order to reuse the same socket, it would be advantageous to have the socket accept IC modules of any thickness, as long as the variations are confined within certain acceptable bounds. The reusability of a module is particularly important for CMOS products, where burn-in is of greater importance than, for instance, bipolar products, and which must be performed on a regular basis to ensure proper reliability of the product. Having to procure a personalized design that accounts for every type of module adds considerably to the cost of the product, and oftentimes makes the product uneconomical.

Another consideration which makes an IC socket highly desirable is its ability of leaving the IC chip exposed to the flow of air. Many designs are such that the IC chip or module are "buried" or sunk deep inside a base or are isolated from the environment by a cover. In both instances, much of the advantage of exposing the device to a free flow of air is sharply curtailed.

A typical burn-in socket is described in U.S. Pat. No. 5,409,392 to Marks et al. It includes a base, a top, contacts, and movable latches. Additionally, the socket is provided with a stripper plate which serves as the table for supporting the IC to be tested. Typically, the socket is provided with a plurality of holes aligned with the engagement parts of the contacts. Whereas such a socket can be used for leaded or leadless ICs, its construction is such that it cannot be adapted to modules of varying thickness.

Another socket used for burn-in testing is described in U.S. Pat. No. 5,312,267 to Matsuoka et al., in which a socket is provided with a pressure cover which can be opened and closed through a pivotal hinge. In a similar arrangement, disclosed in U.S. Pat. No. 4,456,318, to Shibata et al., an IC socket is provided with a base, a cover and a rotary lever coupled to a locking/unlocking mechanism which makes use of a sliding movement of the cover over the base on the basis of the rotation of the rotary lever. The IC is loaded after the "clam shell" style lid is opened. In both patents '267 and '318, the construction of such sockets precludes having the IC exposed to a free flow of air, by having the IC clamped deep inside the socket, which inhibits a forced convective cooling.

In yet another example of a state of the art socket, disclosed in U.S. Pat. No. 4,846,703, to Matsuoka et al., is an IC socket provided with a support that can be moved to an upper and lower position without having to apply undesired pressing forces. Sockets of this nature are designed only for lead frame IC and cannot be used, e.g., for land-grid-arrays. Moreover, in this patent, once the IC is loaded, electrical contact latches are retracted and then released over the leads of the IC. This makes an apparatus of this kind highly specialized and not readily adaptable to modules of varying thickness.

In summary, typical state of the art IC burn-in sockets suffer from one or several of the above limitations. They either precluded accepting modules of varying thickness (a cover, for instance, may not close in the presence of a thick module) or the chip and/or module are placed deep inside the socket that greatly reduces the effect of forced convective cooling.

OBJECTS OF THE INVENTION

Accordingly, it is an object of the present invention to provide a reusable IC socket assembly which is readily adaptable to modules having varying thickness.

Another object of the invention is to provide an IC socket assembly which allows the module to have full access to forced convective cooling.

Yet another object of the invention is to have a socket assembly that allows the module to slide under a set of jaws without requiring any additional motion of the jaws.

Still another object of the invention is to have a compact socket assembly of such design that permits a large number of sockets to be placed in a furnace.

It is yet another object of the invention to provide a socket assembly which may adapted to either a modular or to an integral design, without the socket losing the aforementioned advantages.

SUMMARY OF THE INVENTION

In order to achieve the above objects, there is essentially provided an integrated socket assembly for holding an IC module during testing or burn-in including: a base with contacts that provide electrical signals to the module; movable jaw means for securing the module on the base; camming means for controlling the movement of the movable jaw means; and bridging means responsive to the camming means for providing the jaws means with a compliant clamping force.

In another embodiment of the present invention, there is provided a modular socket assembly for holding an IC module during testing or burn-in including: a printed circuit board; an interposer placed on the printed circuit board, and having electrical contacts to provide electrical signals to the module; a clamp assembly placed on top of the interposer and fastened to the printed circuit board; and movable jaw means for locking the module against the electrical contacts of the interposer; camming means attached to the clamp assembly for controlling the movement of the movable jaw means; and bridging means attached to the clamp assembly responsive to the camming means for providing the jaws means with a compliant clamping force.

BRIEF DESCRIPTION OF THE DRAWINGS

The foregoing and other objects, aspects and advantages of the invention will be better understood from the following detailed description of a preferred embodiment of the invention with reference to the drawings, in which:

FIGS. 4a-4c show a series of diagrams showing the insertion of a module into the IC socket, wherein FIG. 4a is a cut-away view detailing the open state of the IC socket and the relative position of the module in its first stage of insertion, FIG. 4b is a cut-away view detailing the open state of the IC socket and the relative position of the module in an intermediate stage of insertion, and FIG. 4c is a cut-away view detailing the open state of the IC socket and the final position of the module once fully inserted;

FIGS. 5a-5c show a series of diagrams showing the relative motion of the IC socket as the module is clamped to the interposer, wherein FIG. 5a shows the module placed in the opened IC socket, with the jaws fully released, FIG. 5b illustrates an intermediate position adopted when the jaws push the IC module against the electrical contacts of the interposer; and FIG. 5c shows the bridge elements in their final position when the actuation lever is in a locked position.

DETAILED DESCRIPTION OF THE INVENTION

Figure 1:
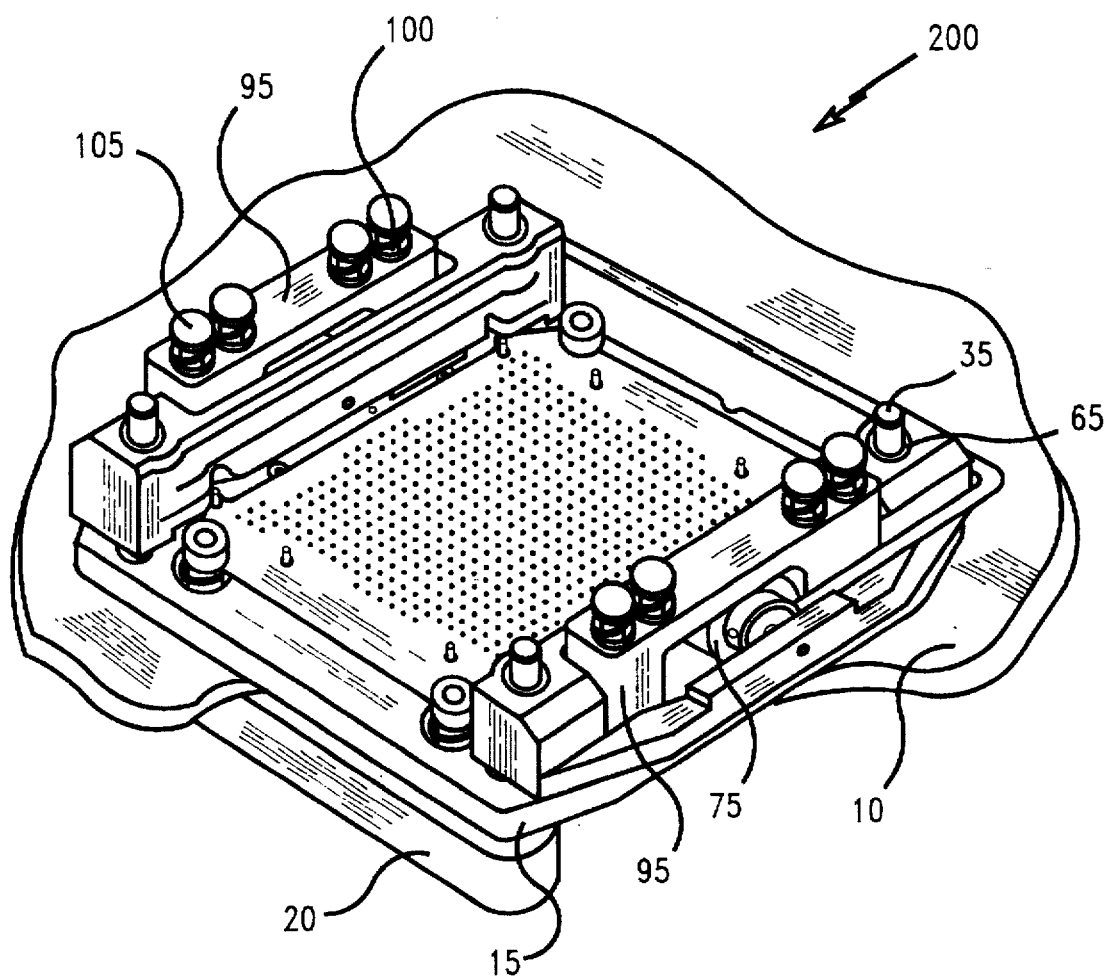
FIG. 1 is a perspective view illustrating a preferred embodiment of the IC socket fastened to a printed circuit board, in accordance with the present invention.

Referring now to FIG. 1, a clamp assembly 200 is shown attached a printed circuit board 10 and a stiffener plate 20.

Figure 2:
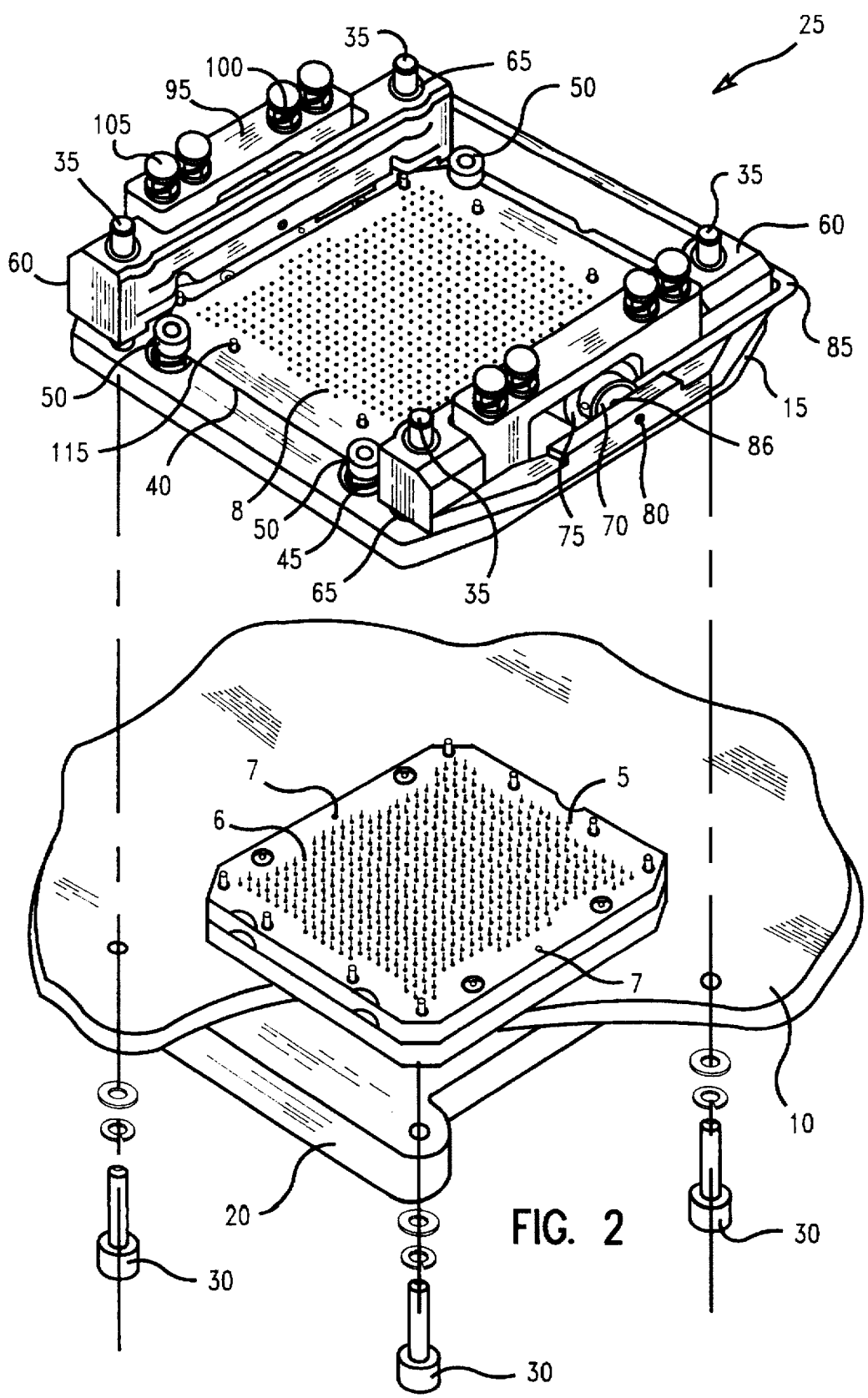
FIG. 2 is a schematic diagram of an isometric view of the IC socket exploded to show the clamp assembly separated from the printed circuit board, interposer and stiffener plate.

For clarity sake, the same clamp assembly 200 is shown in FIG. 2 partially exploded, showing the interposer 5 aligned with the printed circuit board 10 by dowel pins 7. The interposer houses a plurality of electrical contacts 6 that provide electrical connection between the module (not shown) and the printed circuit board 10. The interposer 5 is positioned between the printed circuit board 10 and the base plate 15. Preferably, a stiffener plate 20, located on the opposing side of the printed circuit board 10, provides the necessary stiffness to the printed circuit board 10. Stiffener plate 20, interposer 5, printed circuit board 10 and clamp assembly 25 are fastened with respect to each other by four screws 30. These screws are threaded into four shafts 35, which are located in four counter-bored holes in base plate 15. Interposer 5 is interchangeable, to accommodate various surface mount contactor technologies. By way of example, these contactor technologies include Pogo pins, fuzz buttons, buckling beams and the like.

The guard plate 40 consists of an array of holes 8 through which contacts 6 can protrude when the socket is actuated. The guard-plate 40 also protects the contacts 6 from any damage. The guard-plate 40 is supported by four support springs 45, which are held in place by four shoulder screws 50. The shoulder screws 50 are threaded and bolted into the base plate 15.

Figure 3:
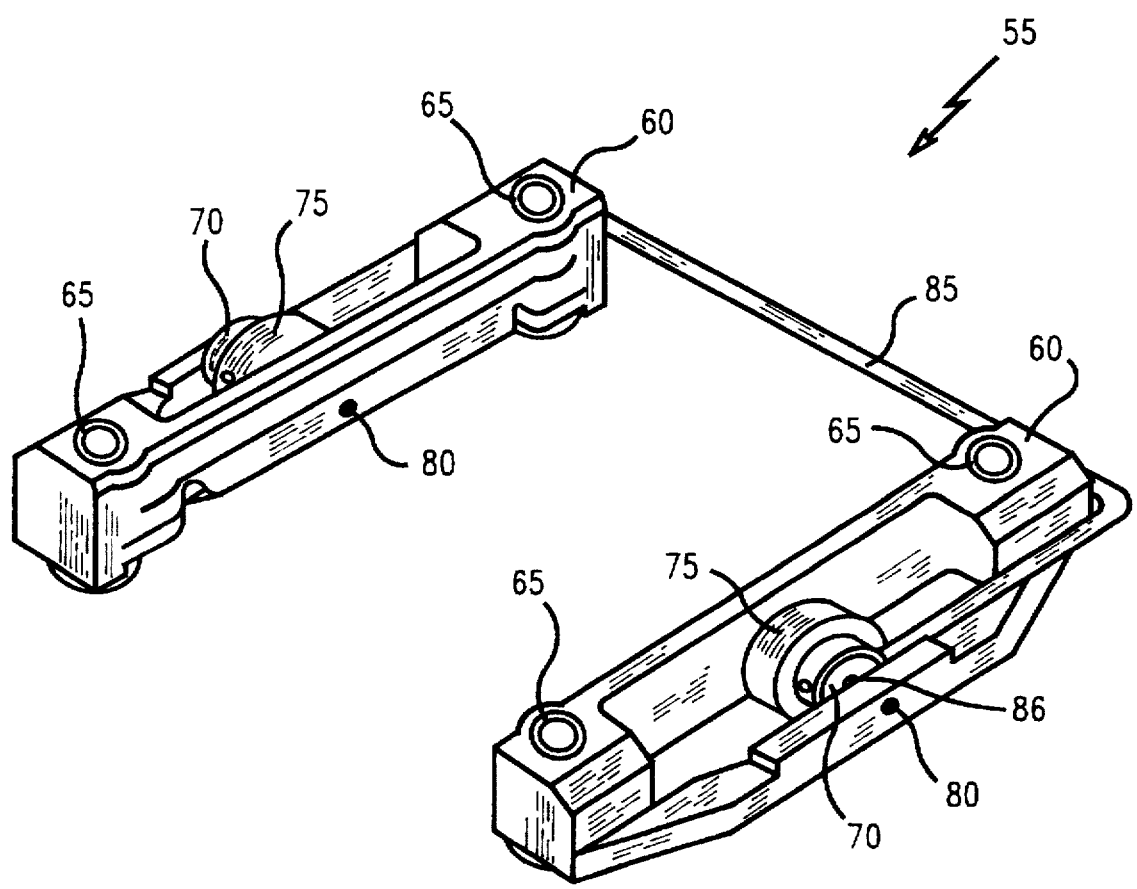
FIG. 3 is a schematic diagram of jaw sub-assembly, and more particularly, the cams, the bearings and the actuation lever.

Referring now to FIG. 3, there is shown a jaw sub-assembly 55. The assembly contains two jaws 60 positioned at opposite sides of the socket, each of which is provided with two bushings 65 that are pressed into the jaw 60. Each jaw contains a cam 70 about which a bearing 75 rotates. The cam 70 is attached to the jaw 60 by a dowel pin 80 via a hole drilled in the cam. The axis of the dowel pin 80 is not collinear with the center axis of the cam 70. Having an off-axis cam provides a camming action when it is rotated about dowel pin 80. A U-shaped actuation lever 85 is pinned by a roll-pin 86 to the two cams 70, each through a hole placed at the center of the cam 70. The actuation lever 85 allows both cams 70 to actuate at once, and provides a mechanical advantage to minimize the force required to overcome the clamping force.

Referring back to FIG. 1, the jaw sub-assembly is located on the four shafts 35, wherein the shafts pass through bushings 65. The bushings facilitate the vertical motion of the jaws relative to the shafts. Two bridge elements 95 are positioned over the two bearings 75 of the jaw sub-assembly and lock the jaw sub-assembly in place. Eight bridge springs 100 are positioned in the eight corresponding holes in the bridge elements 95. Eight spring screws 105 are bolted to the base plate 15, thereby attaching the two bridge elements 95 to the base plate 15.

Referring now to FIG. 3, the socket is opened by moving the actuation lever 85 in a rotational motion, thereby rotating the cams 70 about dowel pins 80. The cams are also secured to the jaws by the same dowel pins 80. The bearings 75 apply a force against the base plate (not shown) which causes the jaws 60 to move in an upward motion on the shafts (not shown). The actuation lever 85 rotates until it hits jaws 60, thereby fully opening the socket.

Figure 4A:
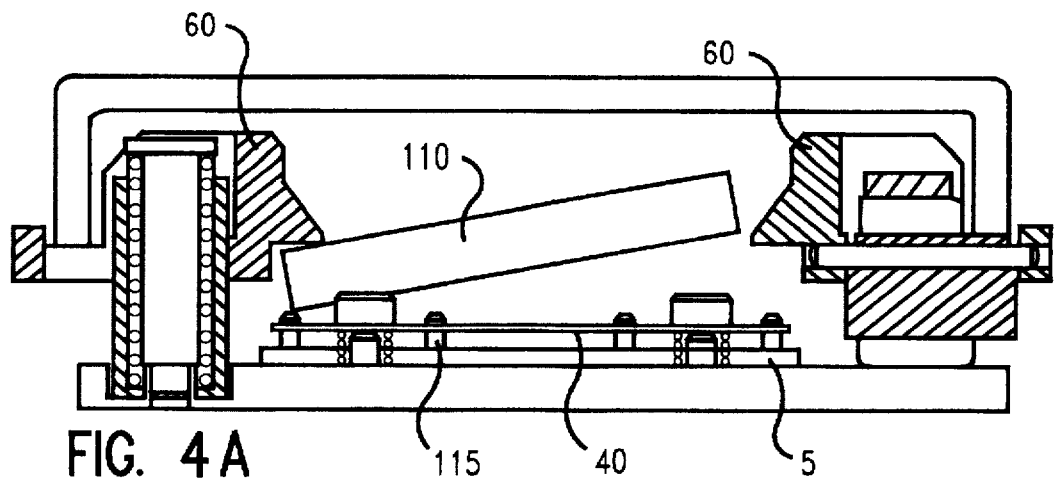
Figure 4B:
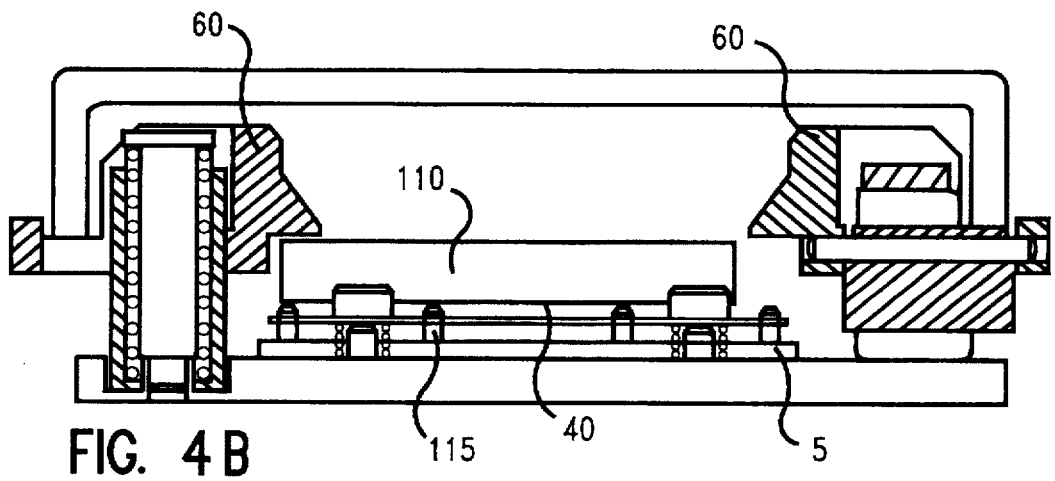
Figure 4C:
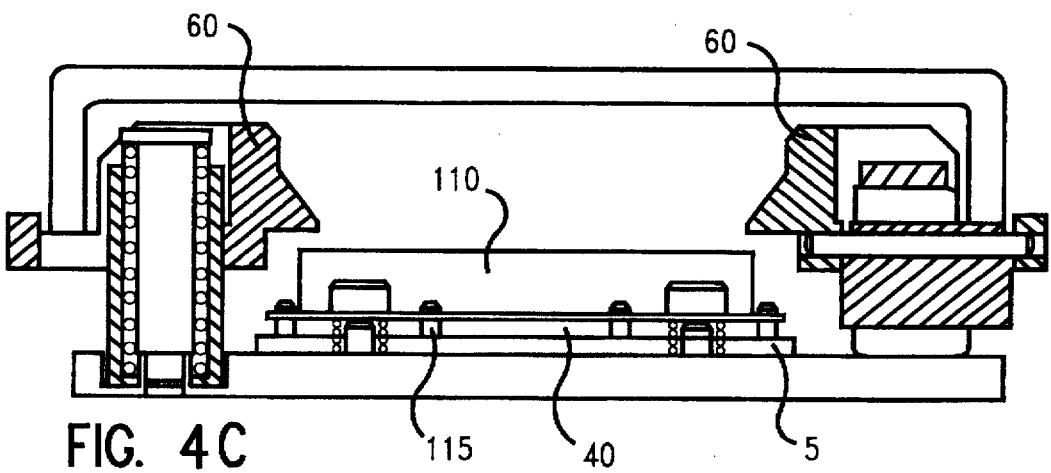

To load a module 110 in the IC socket assembly, reference is made to FIGS. 4a-4c.

The module 110 is placed at an angle of insertion under one of the two jaws 60, as shown in FIG. 4a. Next, the opposite side of the module 110 not properly positioned and still hanging in the air is leveled, as shown in FIG. 4b. Finally, the module 110 is made to slide under the second opposing jaw 60 and lowered onto the guard-plate 40, as shown in FIG. 4c, and is constrained on all sides by the eight interposer dowel pins 115. The interposer dowel pins protrude through the guard plate 40 and are fastened to the interposer 5. The nesting of the module aligns the pads (not shown) of the module 110 to the electrical contacts 6 previously described.

Figure 5A:
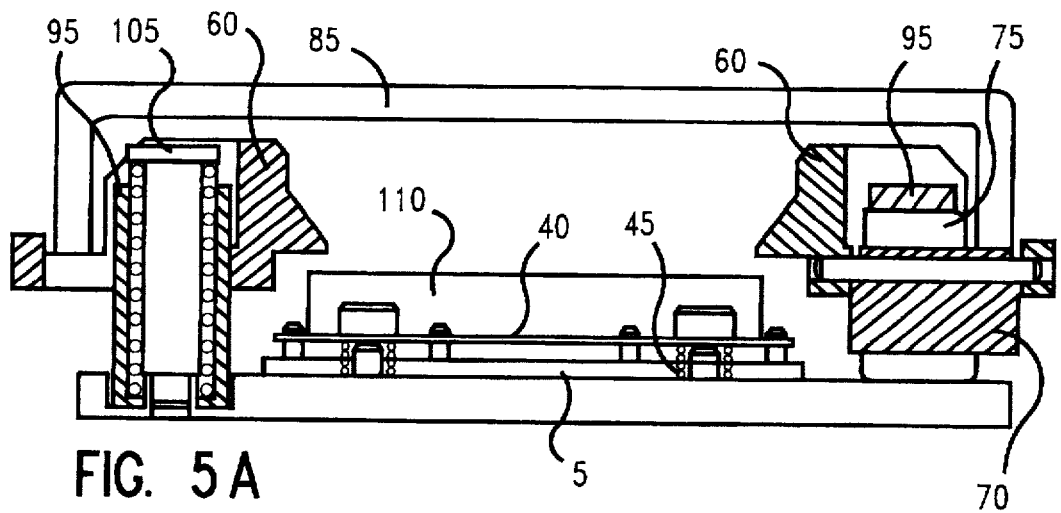
Figure 5B:
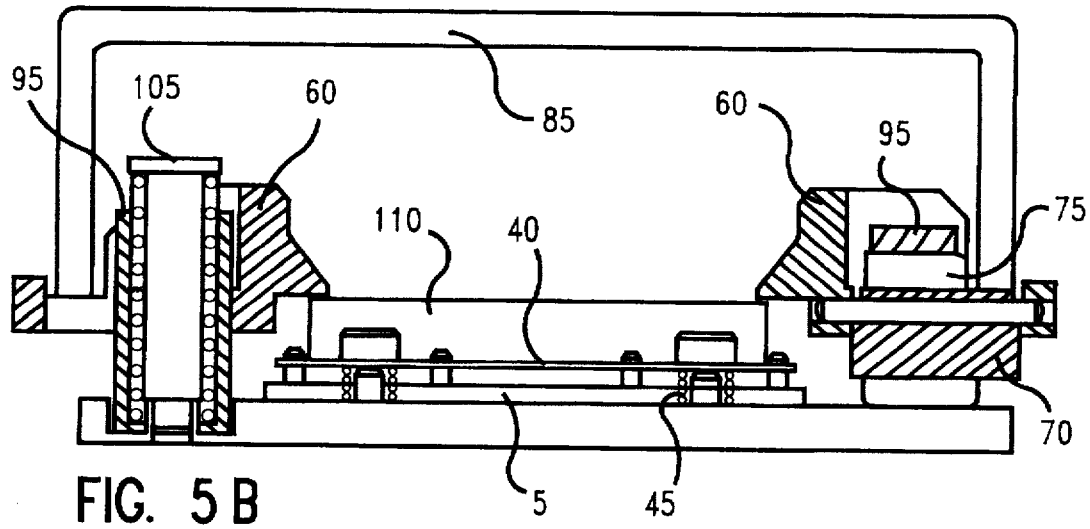
Figure 5C:
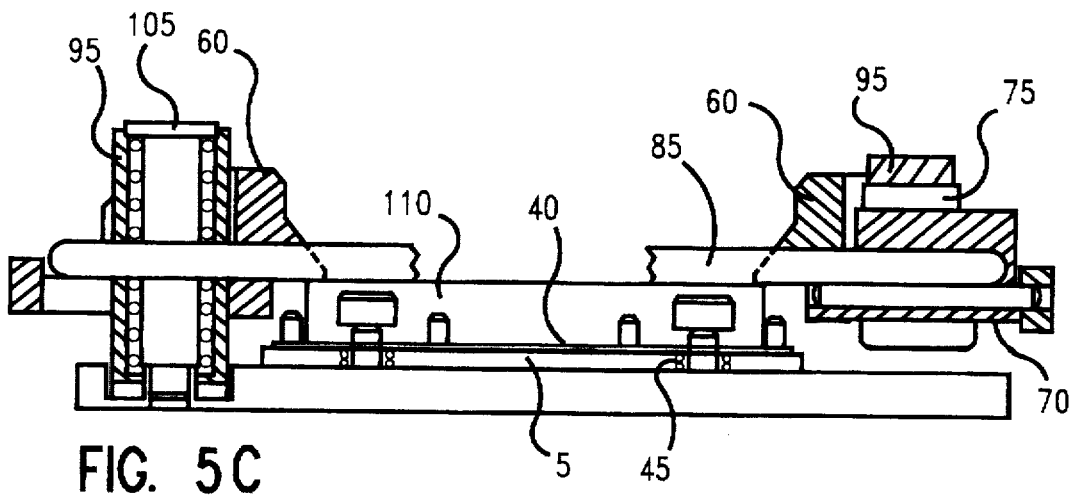

To close the socket and clamp the module 110 against the contacts, reference is made to FIGS. 5a-5c. When the U-shaped lever 85 moves in the reverse direction as described above, the cams 70 are actuated moving the bearings 75 which, in turn, apply a force against the underside of the bridge elements 95. This causes the jaws 60 to move down the shafts (not shown) until contact is made with the upper edge of the module 110. By continuing this motion, the actuation of the lever 85 pushes the module 110 down, thereby pushing down the guard-plate 40 and compressing the four guard plate support springs 45. This motion continues until the module 110 compresses the contacts in the interposer 5. At this point, the jaws 60 cannot move down any further along the shafts (FIG. 5b). As the actuation lever 85 motion continues, the force on the under-side of the bridge elements 95 increases until it overcomes the combined bridge spring forces. The bridge elements 95 then slide up the bridge springs 100 and spring screws 105 until the actuation lever 85 bottoms out on the jaw 60, as shown in FIG. 5c. When the actuation lever 85 is in its fully closed position, the cams 70 are forced past their dwell angle, i.e., the highest point of the cam, thereby locking the actuation lever 85 in place. The same locking kinematic feature exists even in the absence of a module. The module 110 is now firmly clamped in a fixed position on the base sub-assembly.

To remove the module, the same steps are followed in the reverse order.

Although the present invention has been described with reference to a modular socket, wherein the socket is comprised of separate elements, such as: a clamp assembly, an interposer, a printed circuit board, and an optional stiffener, in a second embodiment, the interposer and the clamp assembly can be combined into one integrated unit.

While the invention has been particularly shown and described with reference to a particular embodiment thereof, it will be understood by those skilled in the art that the foregoing and other changes in form or details may be made therein without departing from the spirit and scope of the invention.

What is claimed is:

1. A socket assembly for holding an integrated circuit module during testing or burn-in comprising:

a printed circuit board;

mounted on said printed circuit board, an interposer means provided with electrical contacts;

non-retractable jaw means engaging opposing sides of said module, for urging said module against said interposer means, said jaw means permitting said module to be inserted under said jaw means without requiring a retracting motion of said jaw means;

camming means for controlling the movement of said jaw means; and bridging means responsive to said camming means for providing said jaw means with a compliant clamping force, wherein said jaw means allows said module to be exposed to forced convective cooling from at least two opposing sides and top of said module.

2. The socket assembly as recited in claim 1, further comprising a base surrounding said interposer means.

3. The socket assembly as recited in claim 1, further comprising a stiffener plate positioned under said printed circuit board.

4. The socket assembly as recited in claim 1, further comprising a guard-plate positioned above said interposer means, said guard-plate being provided with holes matching said electrical contacts in said interposer means.

5. The socket assembly as recited in claim 4, wherein said module rests on top of said guard-plate.

6. The socket assembly as recited in claim 1, wherein said jaw means further comprises two jaws placed on opposite sides of said module, said jaws being constrained by shafts that allow for vertical linear motion.

7. The socket assembly as recited in claim 1, wherein said jaw means are located on opposing edges of said module to permit said module to be inserted under said jaw means without requiring a retracting motion of said jaw means.

8. The socket assembly as recited in claim 6, wherein said jaw means further comprises two bushings, a cam and bearings attached to each of said two jaws.

9. The socket assembly as recited in claim 8, wherein said cam and said bearings are attached to said jaws by a pin.

10. The socket assembly as recited in claim 1, wherein said bridging means are attached to said base by screws surrounded by springs.

11. The socket assembly as recited in claim 1, wherein said camming means further comprises an actuation lever.

12. The socket assembly as recited in claim 11, wherein said actuation lever is U-shaped, with each end of said lever being connected to a cam.

13. The socket assembly as recited in claim 12, wherein movement of said U-shaped lever is governed by the rotation of said cam about a pin.

14. The socket assembly as recited in claim 13, wherein said cam is connected to said pin through a hole that is not collinear with the center axis of said cam.

15. The socket assembly as recited in claim 8, wherein said bearings apply a force against said base causing said jaws to move up on said shafts.

16. The socket assembly as recited in claim 8, wherein said bearings apply a force against said bridging means, causing said jaws to move down on said shafts.

17. The socket assembly as recited in claim 8, wherein said jaws urge said module against said electrical contacts of said electrical interposer, and wherein a force generated by said bearings against said bridging means overcomes a spring force of said bridging means, forcing said bridging means to move in an upward motion.

18. The socket assembly as recited in claim 11, wherein said actuation lever in its fully closed position, allows said cams past their dwell angle, thereby locking said actuation lever in place.

19. A modular socket assembly for holding a module during testing or burn-in comprising:

a printed circuit board;

an interposer placed on said printed circuit board, and having electrical contacts to provide electrical signals to said module, said interposer having dow pins to constrain said module in relation to said electrical contacts;

positioned on said dow pins, a guard-plate for protecting said electrical contacts;

non-retractable jaw means engaging opposing sides of said module, for urging said module against said interposer means, said jaw means permitting said module to be inserted under said jaw means without requiring a retracting motion of said jaw means;

camming means for controlling a movement of said jaw means; and bridging means responsive to said camming means for providing said jaw means with a compliant clamping force, wherein said jaw means allow said module to be exposed to forced convective cooling from at least two opposing sides and top of said module.

20. The socket assembly as recited in claim 19, further comprising a stiffener plate positioned under said printed circuit board.

21. The socket assembly as recited in claim 20, wherein said interposer is removable and interchangeable to allow for a variety of contacting technologies.

22. A socket assembly for holding an integrated circuit module during testing or burn-in comprising:

an interposer provided with electrical contacts and a board supporting said interposer;

a clamp assembly on said interposer, comprising:

a base and four shafts positioned at each corner of said base;

non-retractable jaws for securing said module against said interposer and placed on opposite sides of said base, said jaws being guided by said shafts to constrain said jaws to a vertical motion, said jaws further allowing said module to be inserted under said jaws when said jaws are in an upper position, and without requiring a retracting motion of said jaws;

camming means for controlling the movement of said jaws comprising an actuation lever, wherein said lever is connected at each end of said camming means;

bridging means responsive to said camming means for providing said jaws with a compliant clamping force, wherein said jaws urge said module against said interposer electrical contacts, wherein a force generated by said camming means against said bridging means overcomes a spring force of said bridging means, forcing said bridging means to move in an upward motion to accommodate for varying thicknesses of said module, and wherein said jaws allow said module to be exposed to forced convective cooling from at least two opposing sides and top of said module.

* * * * *